(12) United States Patent
Chuang

(10) Patent No.: US 6,196,302 B1
(45) Date of Patent: Mar. 6, 2001

(54) HEAT SINK WITH MULTI-LAYER DISPERSION SPACE

(76) Inventor: Wen-Hao Chuang, No. 13, Ta Chuan 2nd Lane, Ta-Wan Tsun, Jen-Wu Hsiang, Kaohsiung Hsien (TW)

(*) Notice: Subject to any disclaimer, the term of this patent is extended or adjusted under 35 U.S.C. 154(b) by 0 days.

(21) Appl. No.: 09/270,662

(22) Filed: Mar. 16, 1999

(51) Int. Cl.⁷ .................. F28F 7/00; F24H 3/02; H05K 7/20
(52) U.S. Cl. .......... 165/122; 165/80.3; 165/185; 361/695; 361/697
(58) Field of Search .............. 165/104.33, 80.3, 165/122, 121, 185; 361/695, 697, 700

(56) References Cited

U.S. PATENT DOCUMENTS

| | | | |
|---|---|---|---|
| 3,766,977 | * 10/1973 | Pravda et al. | 165/80.3 |
| 5,504,650 | * 4/1996 | Katsui et al. | 165/80.3 |
| 5,609,201 | * 3/1997 | Anderson et al. | 165/80.3 |
| 5,638,895 | * 6/1997 | Dodson | 165/80.3 |
| 5,785,116 | * 7/1998 | Wagner | 165/80.3 |
| 5,787,971 | * 8/1998 | Dodson | 165/80.3 |
| 5,896,917 | * 4/1999 | Lemont et al. | 165/80.3 |
| 6,043,980 | * 3/2000 | Katsui | 165/185 |

* cited by examiner

Primary Examiner—Ira S. Lazarus
Assistant Examiner—Tho Duong
(74) Attorney, Agent, or Firm—Birch, Stewart, Kolasch & Birch, LLP

(57) ABSTRACT

A heat sink with a multi-layer dispersion space is directly molded to form an upper and a lower flowing layer. A twin fan design is incorporated into the main body of the heat whereby a pair of centered circular recesses respectively formed for the reception of the cooling fans in the main body of the heat sink. In addition, fan supporters are fixed within the respective circular recesses in order to anchor said cooling fans to the main body of the heat sink; wherein each fan supporter comprises a stopping plate for diverting flow from the lower flowing layer tangentially from the respective fan recess.

5 Claims, 6 Drawing Sheets

HEAT SINK WITH MULTI-LAYER DISPERSION SPACE

BACKGROUND OF THE INVENTION

This invention relates to a heat sink with multi-layer dispersion space, particularly to a heat sink in a new structure that can raise efficiency of heat dispersion.

A cooling fan is usually installed directly on a heat sink to expel hot air through lateral channels for cooling down a CPU, however, as the heat produced by the CPU is concentrated at the contact face of the CPU and the heat sink, while most of the airflow produced by the cooling fan can hardly blow on abovesaid contact face; and moreover the adopted open type heat sink cannot keep the cooling airflow long enough, so that the combined cooling device can only attain a limited cooling efficacy.

SUMMARY OF THE INVENTION

The heat sink of this invention is composed of a plurlity of heat dispersion posts that form a lot of zigzag space which is further partitioned or directly molded to form an upper and a lower flowing layer. The lower flowing layer is provided with a cooling fan for sucking airflow from the upper flowing layer to enter the lower flowing layer and blow directly on the CPU to expel the hot air inside to achieve a high efficiency heat dispersion.

By realizing the multi-layer flowing mechanism, the heat dispersion area is increased and the cooling air is blowing on the CPU directly and confined by the zigzag space to stay longer, so that a better heat dispersion efficacy can be obtained.

Advantages of this invention may be summarized as:

1. Application of the zigzag space can increase heat dispersion area and confine the cooling air to stay longer thereby raising heat dispersion efficacy.

2. Design of twin fans and stopping plates facilitate a proper blockade and guidance for concentrating the cooling air to blow on the contact face of the CPU.

3. Operation of the cooling fan in a sealed space will reduce noise and enhance air supply.

BRIEF DESCRIPTION OF THE DRAWINGS

For a better understanding to the present invention, together with further advantages or features thereof, at least one preferred embodiment will be elucidated below with reference to the annexed drawings in which.

DETAILED DESCRIPTION OF THE PREFERRED EMBODIMENT

Figure 1:
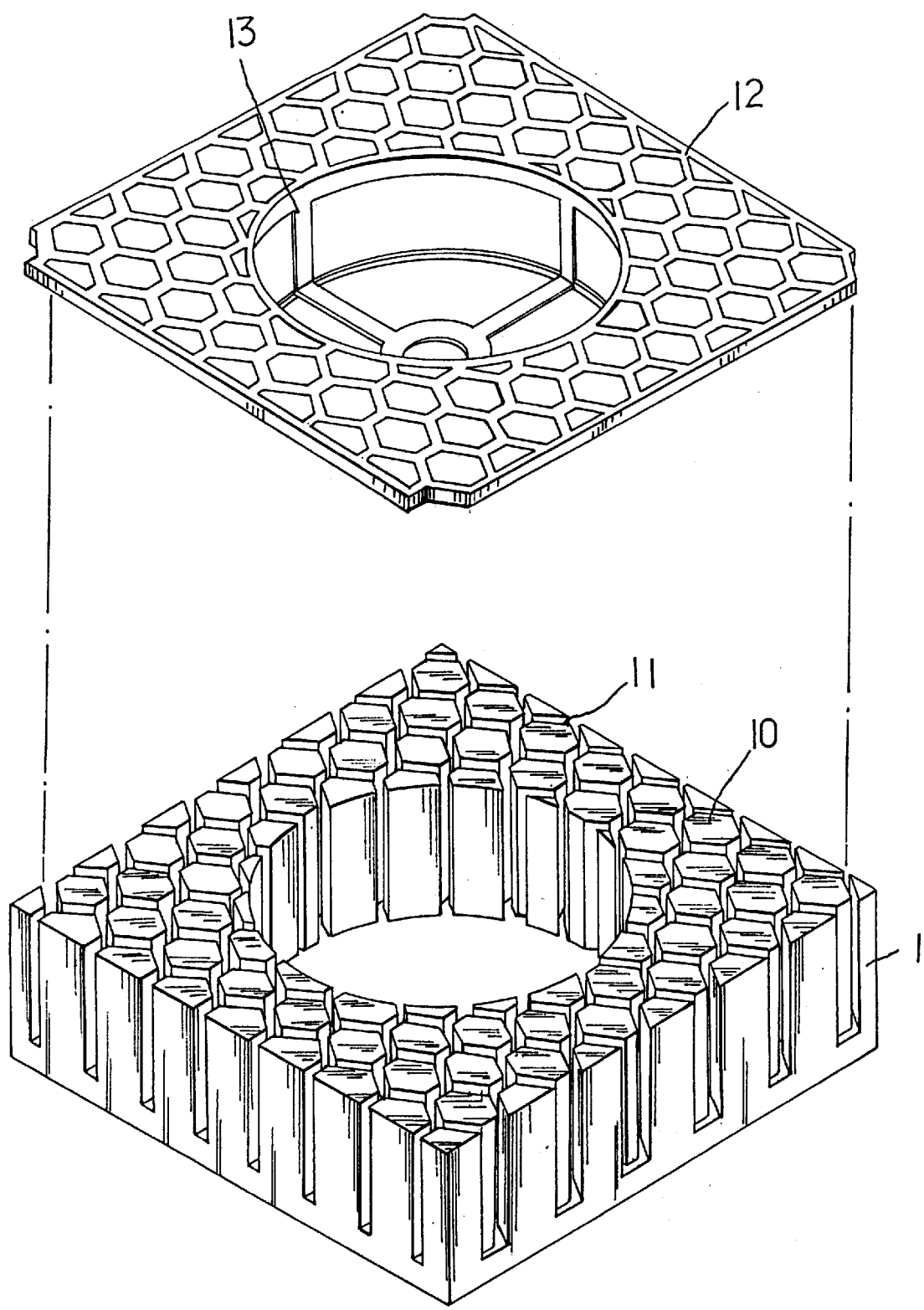
FIG. 1 is a three-dimension exploded view of this invention.
Figure 2:
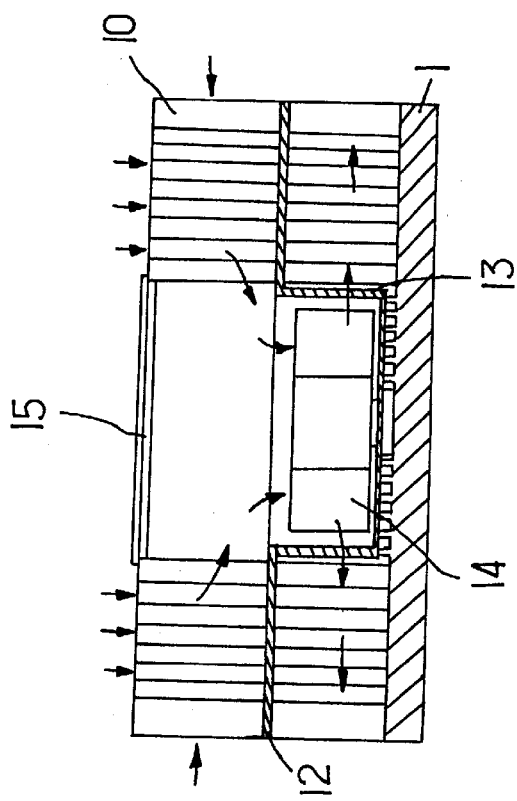
FIG. 2 is a schematic diagram showing heat dispersion and airflow of this invention.

As shown in FIGS. 1 and 2, a heat sink 1 of this invention having a plurlity posts 10 located on its main body, wherein a zigzag flowing space 11 is formed between the posts 10, a partition 12 with compatible shape to the zigzag flowing space 11 is arranged to separate the latter into an upper and a lower flowing layer. A circular recess centered in the partition 12 is extended downwards to form a fan supporter 13 for fixing a cooling fan 14 down to the lower flowing layer, and the recess is covered with a shield 15 on its top to enable the cooling fan 14 to suck cooling air from the upper flowing layer to enter the zigzag lower flowing layer for heat dispersion (as shown in FIG. 2).

Figure 3:
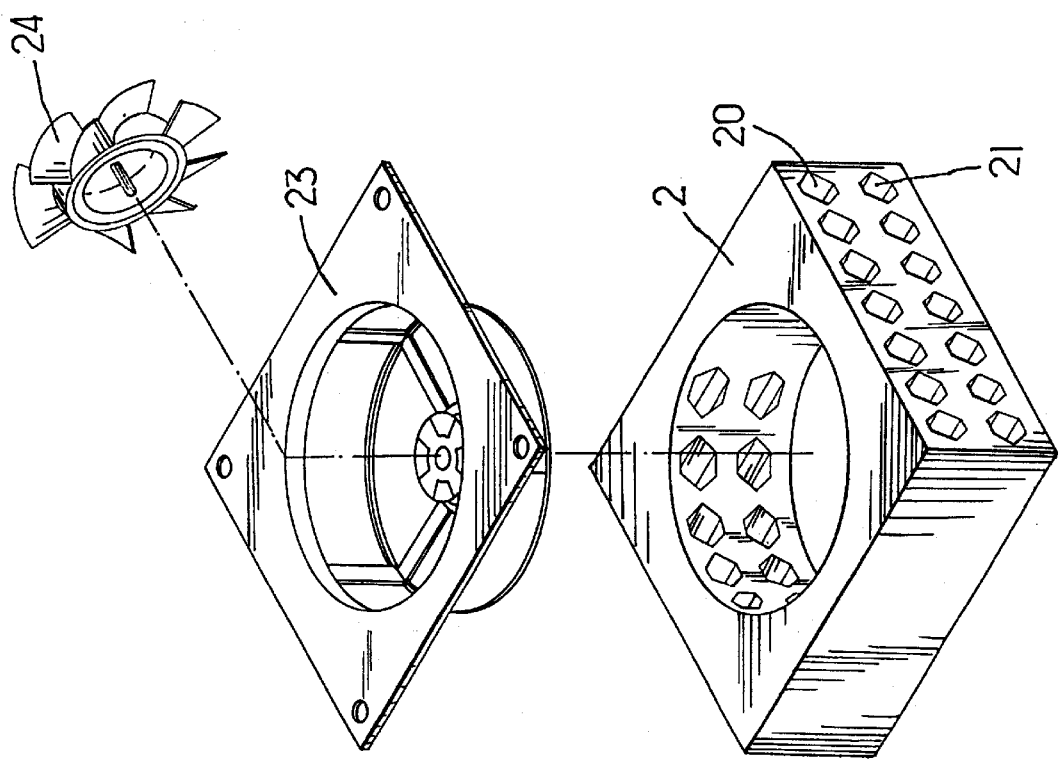
FIG. 3 is an exploded structural view of a preferred embodiment of this invention.
Figure 4:
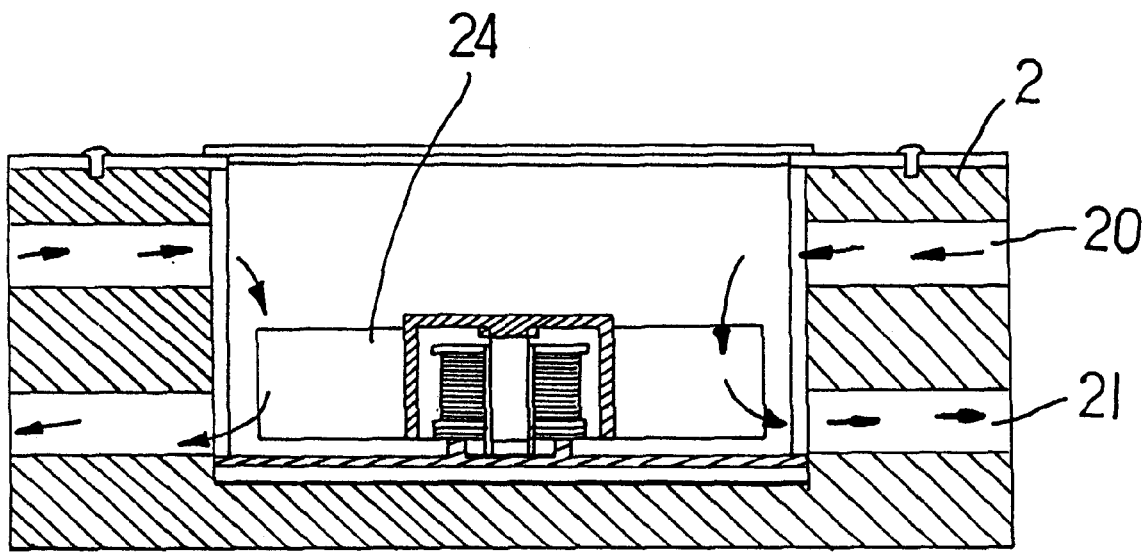
FIG. 4 is a cutaway sectional view of a preferred embodiment of this invention.
Figure 5:
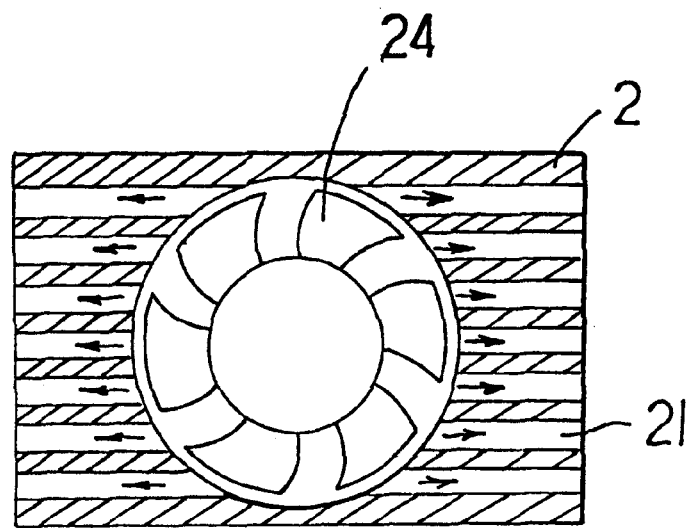
FIG. 5 is a schematic diagram showing heat dispersion and airflow of a preferred embodiment of this invention.

As shown in FIGS. 3 and 4, a heat sink 2 is molded directly to form an upper and a lower honeycomb flowing layer 20, 21, and a center recess 22 is used to fix a fan supporter 23 to permit a cooling fan 24 to be anchored down to the lower flowing layer 21, so that the air in the upper honeycomb flowing layer 20 will be sucked by the cooling fan 24 to enter the lower honeycomb flowing layer 21 for heat dispersion (as shown in FIG. 5).

Figure 6:
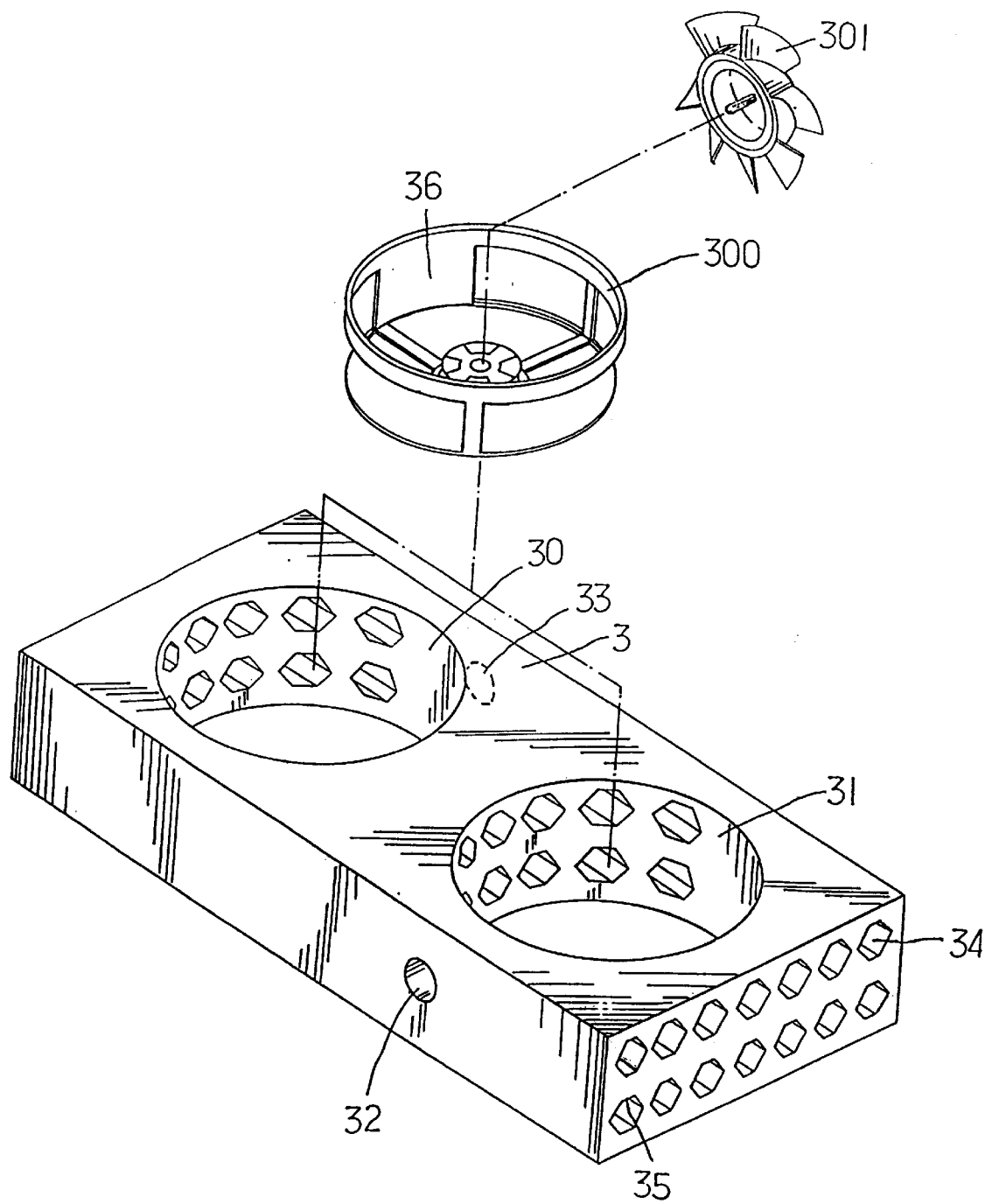
FIG. 6 is a schematic structural view of another embodiment of this invention.
Figure 7A:
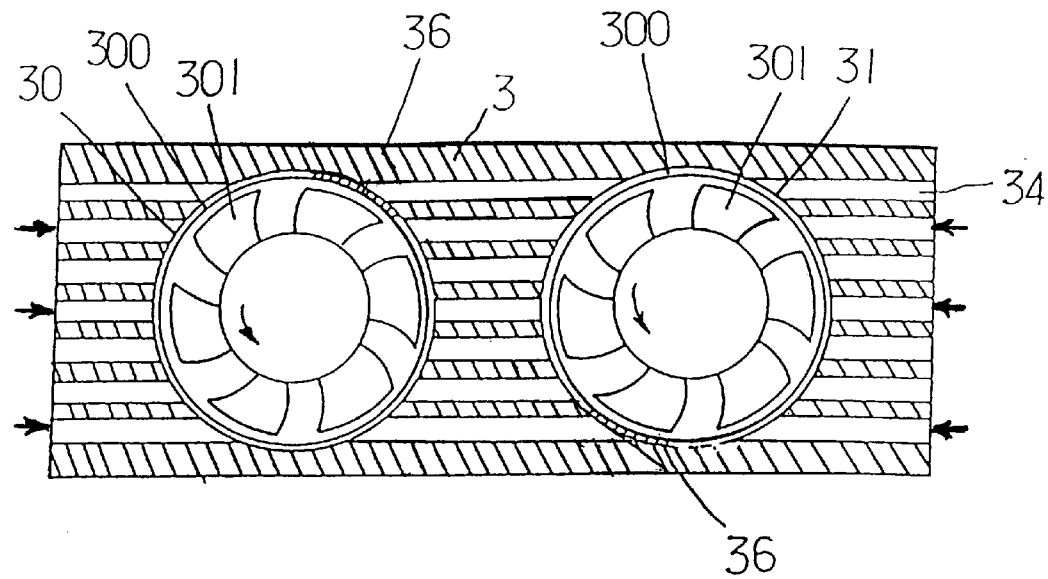
FIG. 7A and FIG. 7B are views showing heat dispersion and airflow of another embodiment of this invention.
Figure 7B:
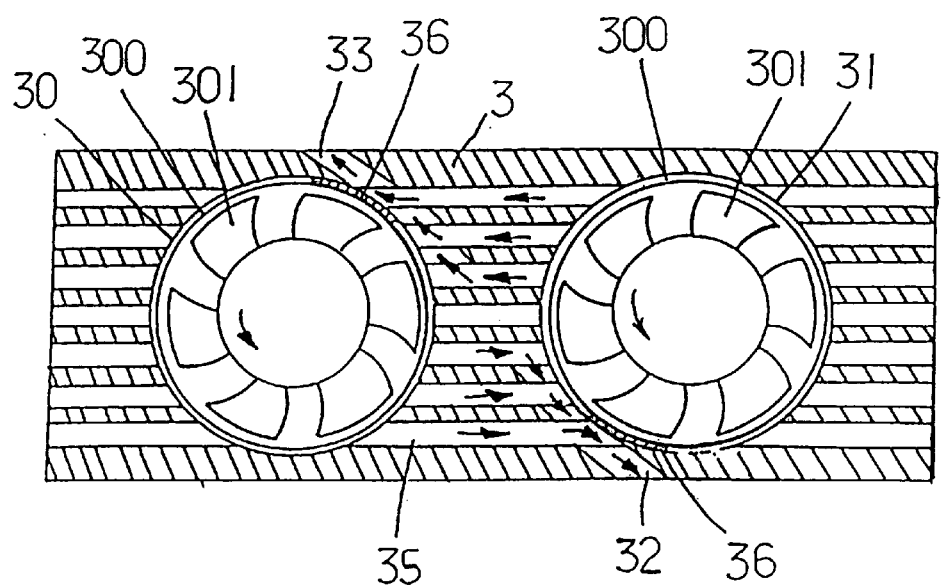

FIGS. 6, 7A and 7B indicate a structure of a bi-directional heat sink 3, wherein a design of twin fans is applied; an upper and a lower flowing layer 34, 35 are available; a couple of heat dispersion openings 32, 33 is arranged along a tangent line of each fan reception recess 30, 31 in the heat sink 3. The lower flowing layer 35 corresponding to the heat dispersion opening 32, 33 is clogged by a stopping plate 36 extended from a fan supporter. When those two cooling fans operate to supply air a contact face of a CPU, heat is dispersed through the openings 32, 33. FIGS. 7A and 7B represent cross-sectional views of the heat sink as seen at the upper flowing and lower flowing layers, respectively. As seen in FIGS. 7A and 7B, a plurality of centered circular recesses 30, 31 are formed in the main body of the heat sink in order to receive the twin cooling fans 301. In addition, in order to anchor the cooling fans 301 to the main body of the heat sink, fan supporters 300 are fixed into their respective recesses 30, 31. Each fan supporter also includes a stopping plate 36 for diverting flow from the flowing layers tangentially from the respective fan recess and through the heat dispersion openings 32,33.

Figure 8:
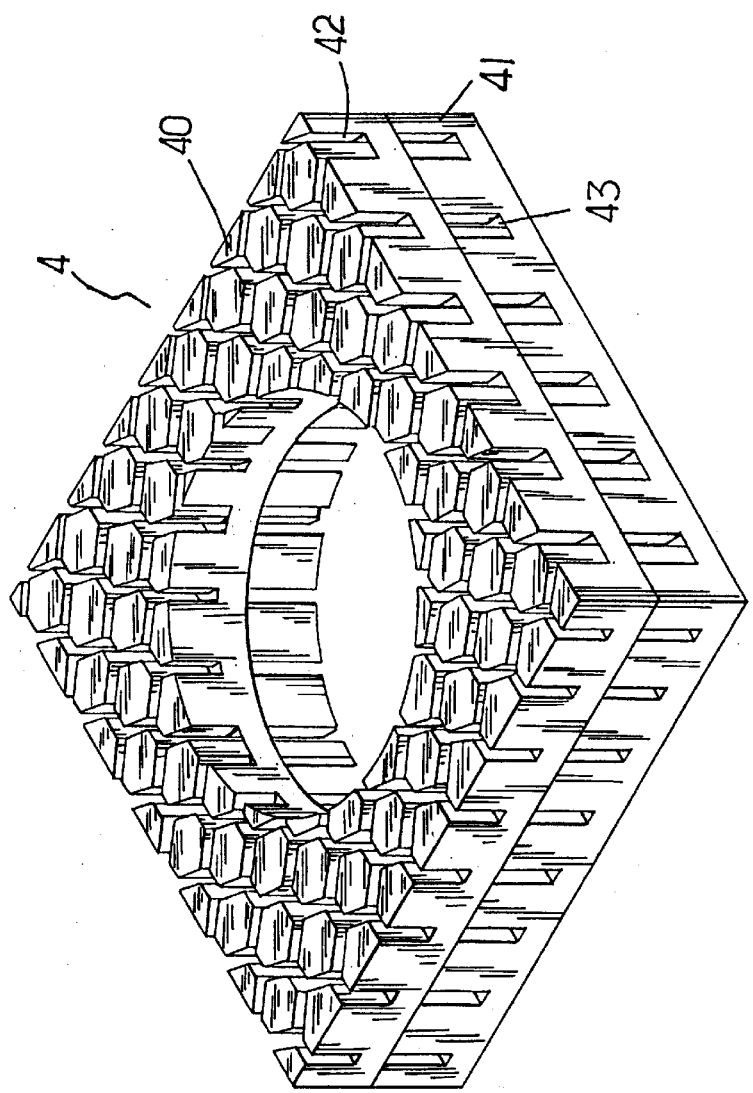
FIG. 8 is a schematic structural view of a further embodiment of this invention.

FIG. 8 indicates another embodiment of a heat sink 4 of this invention, which is constructed by overlapping two identical heat dispersion bodies 40, 41 to form a structure of heat sink with an upper and a lower flowing layer 42, 43.

Figure 9:
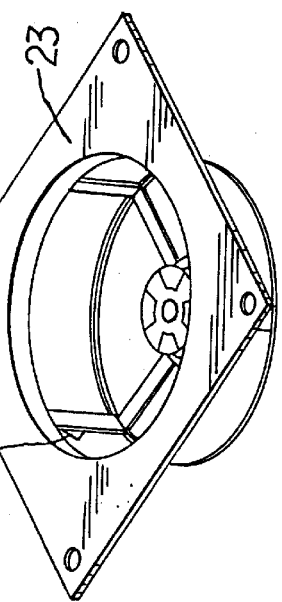
FIG. 9 is a schematic view showing an embodiment of a fan supporter of this invention.

As shown in FIG. 9—a further embodiment of fan supporter 23, wherein a snap piece 230 is disposed on the fan supporter 23 to snap and fasten in the heat dispersion flowing space for waiving use of screws.

What is claimed is:

1. A heat sink having a main body with a multi-layer dispersion space comprising:

a plurality of cooling fans;

a plurality of centered circular recesses respectively formed for the reception of the cooling fans in the main body of said heat sink; wherein said heat dispersion space is directly molded to said main body to form an upper and a lower flowing layer;

a plurality of fan supporters fixed within the respective circular recesses in order to anchor said cooling fans to the main body of the heat sink; wherein each fan supporter comprises a stopping plate for diverting flow from the lower flowing layer tangentially from the respective fan recess.

2. The heat sink according to claim 1, wherein each stopping plate diverts flow from the lower flowing layer tangentially from the respective fan recess and through a plurality of heat dispersion openings.

3. The heat sink according to claim 1, wherein the heat sink is a bi-directional in operation.

4. The heat sink according to claim 3, wherein the upper flowing layer permits the flow of cooling air through the heat sink in a direction opposite to a direction of flow of cooling air through the heat sink in the lower flowing layer.

5. The heat sink according to claim 1, wherein the upper and lower flowing layers can be honeycomb, angular, or circular in shape.

* * * * *